United States Patent
Shin et al.

(10) Patent No.: US 11,004,900 B2
(45) Date of Patent: May 11, 2021

(54) MAGNETORESISTIVE RANDOM ACCESS MEMORY DEVICE AND METHOD OF MANUFACTURING THE SAME

(71) Applicant: SAMSUNG ELECTRONICS CO., LTD., Suwon-si (KR)

(72) Inventors: Hee-Ju Shin, Seoul (KR); Ung-Hwan Pi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 30 days.

(21) Appl. No.: 16/512,627

(22) Filed: Jul. 16, 2019

(65) Prior Publication Data

US 2020/0251527 A1 Aug. 6, 2020

(30) Foreign Application Priority Data

Jan. 31, 2019 (KR) .................. 10-2019-0012659

(51) Int. Cl.
| | | |
|---|---|---|
| *H01L 27/22* | (2006.01) | |
| *H01L 43/10* | (2006.01) | |
| *G11C 11/16* | (2006.01) | |
| *G11C 11/15* | (2006.01) | |
| *H01L 43/02* | (2006.01) | |

(52) U.S. Cl.
CPC ............ *H01L 27/228* (2013.01); *G11C 11/15* (2013.01); *G11C 11/161* (2013.01); *H01L 43/02* (2013.01); *H01L 43/10* (2013.01)

(58) Field of Classification Search
CPC ......... H01L 43/02; H01L 43/08; H01L 43/10; H01L 27/222; H01L 27/228; H01F 10/329; H01F 10/3295; H01F 10/3222; H01F 10/3231; H01F 10/3236; H01F 10/3254; H01F 10/3286; G11C 19/08; G11C 11/161; G11C 11/15
See application file for complete search history.

(56) References Cited

U.S. PATENT DOCUMENTS

| | | | |
|---|---|---|---|
| 7,897,950 B2 | 3/2011 | Shoji | |
| 8,883,520 B2 | 11/2014 | Satoh et al. | |
| 9,406,875 B2 | 8/2016 | Li et al. | |
| 9,858,975 B1* | 1/2018 | Hatcher | ............ G11C 11/1675 |
| 9,916,882 B2* | 3/2018 | Shirotori | ............ G11C 11/1673 |
| 9,985,201 B2 | 5/2018 | Shirotori et al. | |
| 10,608,169 B2* | 3/2020 | Kim | ............ G11C 11/161 |
| 10,622,047 B2* | 4/2020 | Fukuzawa | ............ H01L 43/12 |
| 10,644,228 B2* | 5/2020 | Sasaki | ............ G11C 11/1659 |
| 10,651,366 B2* | 5/2020 | Shiokawa | ............ G11C 11/1675 |

(Continued)

FOREIGN PATENT DOCUMENTS

| | | |
|---|---|---|
| JP | 2017-059594 A | 3/2017 |
| JP | 2018-074138 A | 5/2018 |

*Primary Examiner* — Earl N Taylor
(74) *Attorney, Agent, or Firm* — Lee IP Law, P.C.

(57) ABSTRACT

An MRAM device includes a first conductive pattern including a material generating a spin orbital torque, a torque transfer pattern contacting a portion of an upper surface of the first conductive pattern, an insulation pattern on a side of the torque transfer pattern and covering the first conductive pattern, and a magnetic tunnel junction (MTJ) structure on the torque transfer pattern, the MTJ structure including a free layer pattern, a tunnel barrier pattern, and a fixed layer pattern sequentially stacked.

20 Claims, 13 Drawing Sheets

(56) References Cited

U.S. PATENT DOCUMENTS

| | | | |
|---|---|---|---|
| 10,658,021 B1* | 5/2020 | Araki | G11C 11/18 |
| 10,734,054 B2* | 8/2020 | Min | G11C 11/18 |
| 10,762,941 B2* | 9/2020 | Shiokawa | H01L 43/02 |
| 10,783,943 B2* | 9/2020 | Guo | H01L 43/10 |
| 10,797,231 B2* | 10/2020 | Sasaki | G11C 11/161 |
| 2008/0088980 A1* | 4/2008 | Kitagawa | H01F 10/329 360/313 |
| 2015/0097159 A1* | 4/2015 | Apalkov | H01F 41/302 257/31 |
| 2016/0149124 A1 | 5/2016 | Guo | |
| 2016/0276006 A1* | 9/2016 | Ralph | G11C 11/1675 |
| 2017/0076769 A1* | 3/2017 | Shirotori | H01L 43/02 |
| 2017/0222135 A1* | 8/2017 | Fukami | H01L 27/228 |
| 2018/0033954 A1* | 2/2018 | Aradhya | H01F 10/3272 |
| 2018/0061467 A1* | 3/2018 | Kan | G11C 11/1675 |
| 2018/0123024 A1 | 5/2018 | Sasaki et al. | |
| 2018/0123026 A1 | 5/2018 | Sasaki et al. | |
| 2018/0159024 A1 | 6/2018 | Buyandalai et al. | |
| 2018/0182954 A1* | 6/2018 | Sayed | H01L 43/08 |
| 2018/0351087 A1* | 12/2018 | Choi | H01F 10/329 |
| 2019/0109281 A1* | 4/2019 | Doyle | G11C 11/161 |
| 2019/0165254 A1* | 5/2019 | Lee | G11C 11/1659 |
| 2019/0305042 A1* | 10/2019 | Chen | G11C 11/1673 |
| 2019/0363244 A1* | 11/2019 | Sasaki | H01F 10/3268 |
| 2020/0043538 A1* | 2/2020 | Mihajlovic | H01L 43/06 |
| 2020/0066968 A1* | 2/2020 | Park | H01F 10/3286 |
| 2020/0075073 A1* | 3/2020 | Sasaki | H01L 43/14 |
| 2020/0106002 A1* | 4/2020 | Song | G11C 11/18 |
| 2020/0136018 A1* | 4/2020 | Ying | G11C 11/1657 |
| 2020/0168664 A1* | 5/2020 | Noh | H01L 43/02 |
| 2020/0194666 A1* | 6/2020 | Araki | H01L 43/06 |
| 2020/0203598 A1* | 6/2020 | Garello | H01L 43/02 |
| 2020/0212291 A1* | 7/2020 | Lin | H01L 43/10 |
| 2020/0212294 A1* | 7/2020 | Lin | H01L 43/04 |
| 2020/0227474 A1* | 7/2020 | O'Brien | H01L 43/14 |
| 2020/0243603 A1* | 7/2020 | Lee | H01L 43/02 |
| 2020/0251527 A1* | 8/2020 | Shin | H01L 43/02 |
| 2020/0266236 A1* | 8/2020 | Gottwald | H01L 43/10 |
| 2020/0279992 A1* | 9/2020 | Pham | H01L 27/105 |
| 2020/0303625 A1* | 9/2020 | Yoshikawa | G11C 11/161 |
| 2020/0312908 A1* | 10/2020 | Oguz | H01L 43/14 |

* cited by examiner

MAGNETORESISTIVE RANDOM ACCESS MEMORY DEVICE AND METHOD OF MANUFACTURING THE SAME

CROSS-REFERENCE TO RELATED APPLICATION

Korean Patent Application No. 10-2019-0012659, filed on Jan. 31, 2019, in the Korean Intellectual Property Office, and entitled: "A Magnetoresistive Random Access Memory Device and Method of Manufacturing the Same," is incorporated by reference herein in its entirety.

BACKGROUND

1. Field

Example embodiments relate to a magnetoresistive random access memory (MRAM) device and method of manufacturing the same. More particularly, example embodiments relate to spin orbit torque-magnetoresistive random access memory (SOT-MRAM) device and method of manufacturing the same.

2. Description of the Related Art

Recently, in order to reduce power consumption, a SOT-MRAM for writing data using a spin orbit torque may be used. The SOT-MRAM may be required to have excellent data writing characteristics. Also, in manufacturing the SOT-MRAM, it may be needed to decrease process defects.

SUMMARY

According to exemplary embodiments, there is provided an MRAM device. The MRAM device may include a first conductive pattern, a torque transfer pattern, an insulation pattern and a magnetic tunnel junction (MTJ) structure. The first conductive pattern may include a material generating a spin orbital torque. The torque transfer pattern may contact a portion of an upper surface of the first conductive pattern. The insulation pattern may be formed on a side of the torque transfer pattern, and may cover the first conductive pattern. The MTJ structure may be formed on the torque transfer pattern, and the MTJ structure may include a free layer pattern, a tunnel barrier pattern, and a fixed layer pattern sequentially stacked.

According to example embodiments, there is provided an MRAM device. The MRAM device may include a first conductive pattern, a torque transfer pattern, and a magnetic tunnel junction (MTJ) structure. The first conductive pattern may include a material generating a spin orbital torque. The torque transfer pattern may contact a portion of the upper surface of the first conductive pattern and protruding in a vertical direction from an upper surface of the first conductive pattern. The MTJ structure may be formed on the torque transfer pattern, the MTJ structure may include a free layer pattern, a tunnel barrier pattern and a fixed layer pattern stacked. The free layer pattern may contact an upper surface of the torque transfer pattern.

According to example embodiments, there is provided an MRAM device. The MRAM device may include a first conductive pattern, a torque transfer pattern, an insulation pattern, a magnetic tunnel junction (MTJ) structure and a second conductive pattern. The first conductive pattern may include a material generating a spin orbital torque. The torque transfer pattern may contact a portion of the upper surface of the first conductive pattern. The insulation pattern may be formed on a side of the torque transfer pattern, and may cover the first conductive pattern. The MTJ structure may be formed on the torque transfer pattern, the MTJ structure may include a free layer pattern, a tunnel barrier pattern and a fixed layer pattern stacked. The second conductive pattern may be formed on the MTJ structure. The torque transfer pattern may contact the free layer pattern, and the second conductive pattern may be electrically connected to the fixed layer pattern.

According to example embodiments, there is provided a method of manufacturing an MRAM device. In the method, a first conductive pattern may be formed on a substrate, the first conductive pattern may include a material generating a spin orbital torque. An insulation pattern may be formed on the first conductive pattern, the insulation pattern may include an opening exposing a portion of an upper surface of the first conductive pattern. A torque transfer pattern may be formed to fill the opening, the torque transfer pattern may contact the portion of the upper surface of the first conductive pattern. A magnetic tunnel junction (MTJ) structure may be formed on the torque transfer pattern, the MTJ structure may include a free layer pattern, a tunnel barrier pattern, and a fixed layer pattern sequentially stacked.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
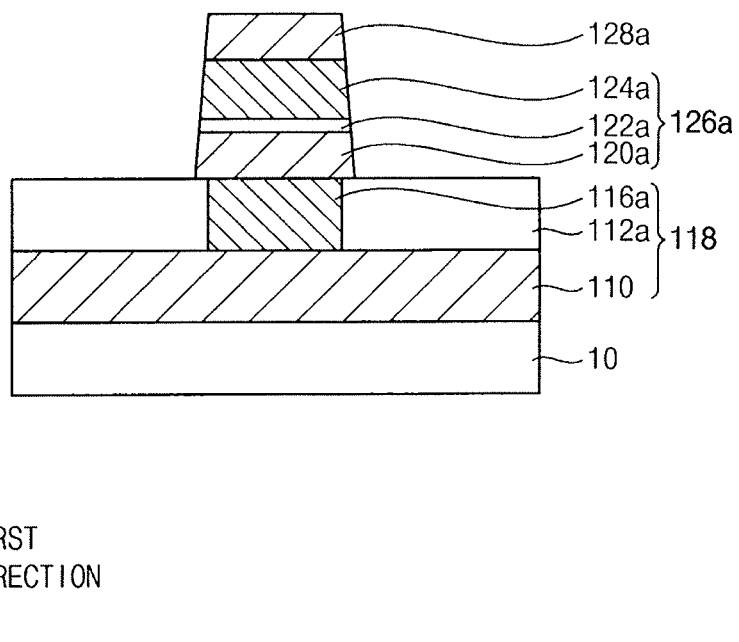
FIG. 1 illustrates a cross-sectional view of a SOT-magnetoresistive memory cell structure in accordance with exemplary embodiments.

FIG. 1 is a cross-sectional view illustrating a SOT-magnetoresistive memory cell structure in accordance with exemplary embodiments. The SOT-magnetoresistive memory cell structure (hereinafter referred to as a memory cell structure) may be used in a spin hall effect-based MRAM or a Rashba effect-based MRAM.

Referring to FIG. 1, a memory cell structure 130 may include a first conductive pattern 110, a torque transfer pattern 116a, an insulation pattern 112a, a magnetic tunnel junction (MTJ) structure 126a, and an upper electrode 128a. In addition, a lower insulation pattern may be further included in the memory cell structure 130.

The memory cell structure 130 may be formed on a lower structure 10. For example, the lower structure 10 may include a substrate. In other example, the lower structure 10 may include a substrate and lower elements formed on or in the substrate.

In exemplary embodiments, the first conductive pattern 110 may be formed on the lower structure 10. The first conductive pattern 110 may have a line shape or an isolated pattern shape (e.g., an island shape). In exemplary embodiments, a longitudinal direction of the first conductive pattern 110 may be a first direction parallel to an upper surface of the lower structure 10.

The MTJ structure 126a may include a free layer pattern 120a, a tunnel barrier pattern 122a, and a fixed layer pattern 124a stacked in the stated order. The MTJ structure 126a may have a pillar shape.

In exemplary embodiments, a lower width of the MTJ structure 126a may be greater than an upper width of the MTJ structure 126a, e.g., along the first direction. That is, a width of the MTJ structure 126a may gradually increase from an upper portion of the MTJ structure 126a to a lower portion of the MTJ structure 126a, e.g., the width may increase from the top of the MTJ structure 126a toward the first conductive pattern 110. A sidewall of the MTJ structure 126a may have an inclination, e.g., with respect an upper surface of the first conductive pattern 110. In some exemplary embodiments, widths of the lower portion and the upper portion of MTJ structure 126a may be substantially the same. In this case, a sidewall of the MTJ structure 126a may be vertical.

In exemplary embodiments, the free layer pattern 120a may have a variable magnetization direction. That is, the magnetization direction of the free layer pattern 120a may be changed by a torque applied to the free layer pattern 120a. For example, when spin-polarized currents flow to the free layer pattern 120a, data may be written in the MTJ structure 126a by changing the magnetization direction of the free layer pattern 120a. The spin hall effect and/or the Rashba effect may be generated by the spin-polarized current, so that data may be easily written in the MTJ structure 126a.

In exemplary embodiments, the free layer pattern 120a may include a ferromagnetic material, e.g., Fe, Co, Ni, Cr, Pt, etc. The free layer pattern 120a may further include boron (B) or silicon (Si). Those may be used alone or in combination of two or more. For example, the free layer pattern 120a may include, e.g., CoFe, NiFe, FeCr, CoFeNi, PtCr, CoCrPt, CoFeB, NiFeSiB, CoFeSiB, etc.

In the exemplary embodiments, the fixed layer pattern 124a may include a pinned pattern, a lower ferromagnetic pattern, an anti-ferromagnetic coupling spacer pattern and an upper ferromagnetic pattern. In this case, the pinned pattern may include, e.g., FeMn, IrMn, PtMn, MnO, MnS, MnTe, $MnF_2$, $FeF_2$, $FeCl_2$. FeO, $CoCl_2$, CoO, $NiCl_2$, NiO, and/or Cr, etc. The lower and upper ferromagnetic patterns may include a ferromagnetic material, e.g., Fe, Ni, and/or Co. The anti-ferromagnetic coupling spacer pattern may include, e.g., Ru, Ir, and/or Rh.

The tunnel barrier pattern 122a may be disposed between the free layer pattern 120a and the fixed layer pattern 124a. Thus, the free layer pattern 120a and the fixed layer pattern 124a may not directly contact each other.

In the exemplary embodiments, the tunnel barrier pattern 122a may include a metal oxide having an insulating property. For example, the tunnel barrier pattern 122a may include magnesium oxide ($MgO_x$) or aluminum oxide ($AlO_x$).

The first conductive pattern 110 may serve as a pattern for writing data in the MTJ structure 126a. The first conductive pattern 110 may be electrically connected to the free layer pattern 120a included in the MTJ structure 126a. That is, a spin orbital torque may be generated in the first conductive pattern 110. The spin orbital torque may be applied to the free layer pattern 120a, so that the magnetization direction of the free layer pattern 120a may be changed. Thus, the first conductive pattern 110 may include a material having a high spin-orbit coupling strength. In addition, the first conductive pattern 110 may include a material for generating the spin hall effect and/or the Rashba effect.

In exemplary embodiments, the first conductive pattern 110 may be a horizontal magnetic material, and the first conductive pattern 110 may include a heavy metal. In exemplary embodiments, the first conductive pattern 110 may include, e.g., Pt, Ta, W, Hf, Ir, CuBi, CuIr, AuW, etc. Those may be used alone or in combination of two or more.

The first conductive pattern 110 may have a thin thickness, e.g., along a third direction normal to the upper surface of the lower structure 10, so that the first conductive pattern 110 may effectively generate the spin-hall effect and/or the Rashba effect, and currents flowing through the first conductive pattern 110 may be decreased. In exemplary embodiments, the first conductive pattern 110 may have a thickness of about 5 Å to about 100 Å, e.g., about 5 Å to about 50 Å.

The lower insulation pattern may be further formed on a side of the first conductive pattern 110, e.g., the lower insulation pattern may be formed in direct contact with a lateral side of the first conductive pattern 110. For example, upper surfaces of the first conductive pattern 110 and the lower insulation pattern may be coplanar with each other. For example, the lower insulation pattern may be identical to and used interchangeably with a lower insulation pattern 140 in FIG. 10 that will be described in more detail below.

In exemplary embodiments, the lower insulation pattern may include, e.g., silicon oxide, silicon nitride, and/or silicon oxynitride, etc. Upper surfaces of the first conductive pattern 110 and the lower insulation pattern may be substantially coplanar with each other.

The torque transfer pattern 116a may be disposed, e.g., directly, between the first conductive pattern 110 and the free layer pattern 120a included in the MTJ structure 126a. That is, the torque transfer pattern 116a may, e.g., directly, contact the upper surface of the first conductive pattern 110 and a lower surface of the free layer pattern 120a.

The torque transfer pattern 116a may be formed to effectively transfer the spin orbital torque generated by the first conductive pattern 110 to the free layer pattern 120a. The torque transfer pattern 116a may include a metal having an excellent transfer efficiency of a spin orbital torque. In exemplary embodiments, the torque transfer pattern 116a may include a material different from a material of the first conductive pattern 110. The torque transfer pattern 116a may have a resistance lower than a resistance of the first conductive pattern 110, e.g., a difference between the resistance of the torque transfer pattern 116a and the resistance of the first conductive pattern 110 may be large.

The MTJ structure 126a may be formed on the torque transfer pattern 116a. Thus, the torque transfer pattern 116a and the MTJ structure 126a may be disposed to face each other in the third direction perpendicular to the upper surface of the first conductive pattern 110. The torque transfer pattern 116a may have a pillar shape.

In exemplary embodiments, a first width of the lower surface of the MTJ structure 126a may be equal to or greater than a second width of the upper surface of the torque transfer pattern 116a, e.g., in the first direction. Thus, the upper surface of the torque transfer pattern 116a may be, e.g., completely, covered, e.g., overlapped, by the MTJ structure 126a.

In exemplary embodiments, the torque transfer pattern 116a may include a metal, e.g., copper, aluminum, tungsten, silver, gold, etc.

The torque transfer pattern 116a may contact a portion of the upper surface of the first conductive pattern 110. That is, the torque transfer pattern 116a may protrude from the upper surface of the first conductive pattern 110 in a vertical direction.

The first conductive pattern 110 and the torque transfer pattern 116a are arranged so that a direction of current flowing from the first conductive pattern 110 through the torque transfer pattern 116a may be changed to the vertical direction from the horizontal direction. That is, the current flows in the first direction at the first conductive pattern 110, and then the direction of the current may change in the third direction at the torque transfer pattern 116a. Thus, the spin torque generated in the first conductive pattern 110 may be effectively transferred to the free layer pattern 120a, as a direction of spin polarized current is changed. Thus, the memory cell structure 130 may have excellent write operation characteristics.

As described above, the first conductive pattern 110 and the free layer pattern 120a may not directly contact to each other, and the torque transfer pattern 116a may be interposed therebetween.

The insulation pattern 112a may be formed on the first conductive pattern 110 and the lower insulation pattern, e.g., on the coplanar upper surfaces of the first conductive pattern 110 and the lower insulation pattern. The insulation pattern 112a may be formed on a side of the torque transfer pattern 116a, e.g., the insulation pattern 112a may be formed in direct contact with a lateral side of the torque transfer pattern 116a. The insulation pattern 112a may surround a sidewall of the torque transfer pattern 116a, e.g., the insulation pattern 112a may surround an entire perimeter of the torque transfer pattern 116a. The insulation pattern 112a may cover the first conductive pattern 110 and the lower insulation pattern. That is, the upper surface of the first conductive pattern 110 may be, e.g., completely, covered with the insulation pattern 112a and the torque transfer pattern 116a. Upper surfaces of the insulation pattern 112a and the torque transfer pattern 116a may be substantially coplanar with each other.

The insulation pattern 112a may include a material that is hardly etched in an etching of MTJ layers for forming the MTJ structure. Therefore, the insulation pattern 112a may serve as an etch stop layer in the etching of the MTJ layers. In exemplary embodiments, the insulation pattern 112a may include, e.g., silicon oxide, silicon nitride, silicon oxynitride, etc. Those may be used alone or in combination of two or more.

A structure including the first conductive pattern 110, the torque transfer pattern 116a, and the insulation pattern 112a may serve as a spin orbital torque (SOT) structure. That is, the magnetization direction of the free layer pattern 120a included in the MTJ structure 126a may be changed to write data in the MTJ structure 126a through a stacked structure of the first conductive pattern 110 and the torque transfer pattern 116a.

The upper electrode 128a may be formed on the upper surface of the MTJ structure 126a. The upper electrode 128a may serve as an etch mask for etching of the MTJ layers. The upper electrode 128a may include a metal.

In exemplary embodiments, the upper electrode 128a may have a resistance lower than a resistance of the first conductive pattern 110. For example, the upper electrode 128a may include, e.g., tungsten, copper, platinum, nickel, silver, gold, etc. In some exemplary embodiments, the upper electrode may not be formed.

As described above, the memory cell structure may have excellent write operation characteristics, and defects of the MTJ structure may decrease.

FIGS. 2 to 9 are cross-sectional views illustrating stages in a method of manufacturing a SOT-magnetoresistive memory cell structure in accordance with exemplary embodiments.

Figure 2:
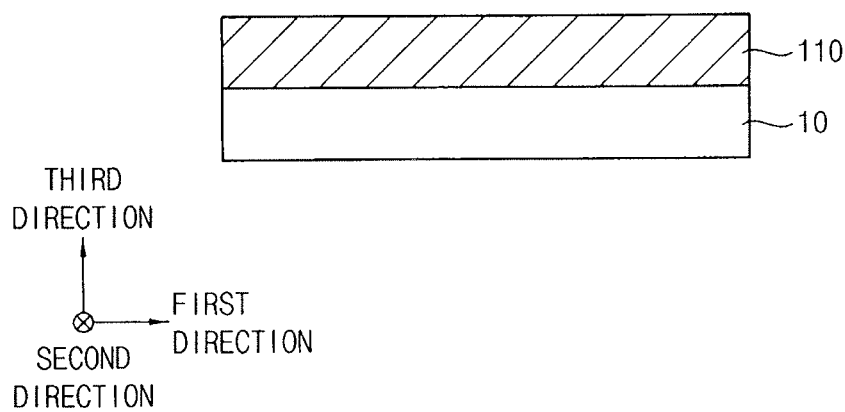
FIGS. 2 to 9 illustrate cross-sectional views of stages in a method of manufacturing a SOT-magnetoresistive memory cell structure in accordance with exemplary embodiments.

Referring to FIG. 2, the first conductive pattern 110 may be formed on the lower structure 10. A lower insulation pattern may be formed on a side of the first conductive pattern 110.

In exemplary embodiments, the first conductive pattern 110 and the lower insulation pattern may be formed by a damascene process. For example, a lower insulation layer may be deposited, and the lower insulation layer may be patterned to form a lower insulation pattern. An opening extending in the first direction may be formed between the lower insulation patterns. Thereafter, a first conductive layer may be formed on the lower insulation pattern to fill the opening. The first conductive layer may be planarized until an upper surface of the lower insulation pattern is exposed to form the first conductive pattern 110 filling the opening. The planarization process may include a chemical mechanical polishing or an etch back process.

In some exemplary embodiments, the first conductive pattern 110 may be formed by a patterning process in relief. That is, the first conductive layer may be formed, and the first conductive layer may be patterned to form the first conductive pattern 110. A lower insulation layer may be formed to cover the first conductive pattern 110. The lower insulation layer may be planarized until an upper surface of the first conductive pattern 110 may be exposed to form the lower insulation pattern. The planarization process may include a chemical mechanical polishing or an etch back process.

The lower insulation pattern may include, e.g., silicon oxide, silicon nitride, and/or silicon oxynitride, etc. As the planarization process is performed, upper surfaces of the first conductive pattern 110 and the lower insulation pattern may be substantially coplanar with each other.

The first conductive pattern 110 may include a material having a high spin-orbit coupling strength. The first conductive pattern 110 may be a horizontal magnetic material and may include a heavy metal. In exemplary embodiments, the first conductive pattern 110 may include, e.g., Pt, Ta, W, Hf, Ir, CuBi, CuIr, AuW, or the like.

In exemplary embodiments, the first conductive pattern 110 may have a thickness of about 5 Å to about 100 Å, e.g., along the third direction. Preferably, the first conductive pattern 110 may have a thickness of about 5 Å to about 50 Å.

Figure 3:
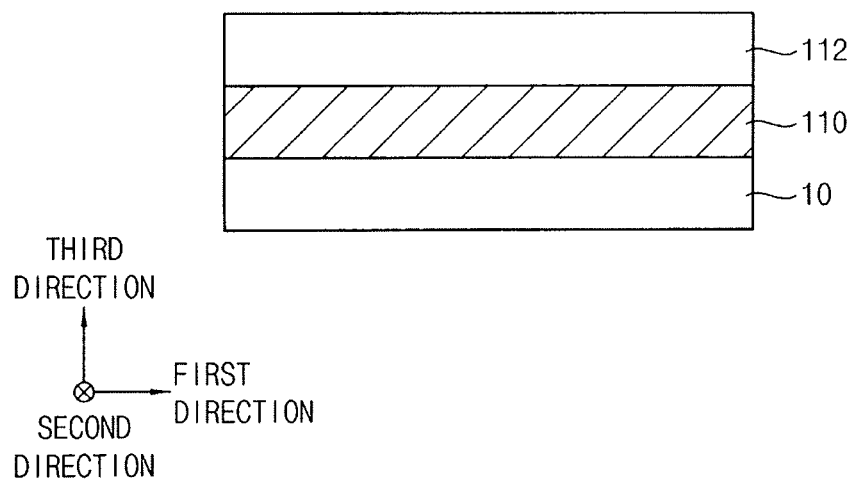

Referring to FIG. 3, a first insulation layer 112 may be formed on the first conductive pattern 110 and the lower insulation pattern. The first insulation layer 112 may include a material that is hardly etched in a subsequent etching of MTJ layers. Thus, the first insulation layer 112 may be used as an etch stop layer in the etching of the MTJ layers.

In exemplary embodiments, the first insulation layer 112 may include, e.g., silicon oxide, silicon nitride, silicon oxynitride, etc. Those may be used alone or in combination of two or more.

Figure 4:
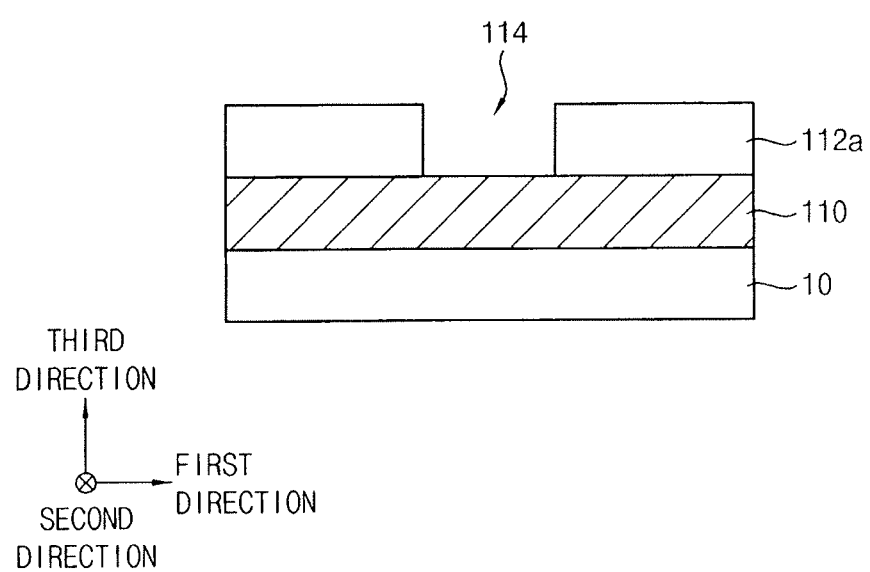

Referring to FIG. 4, a portion of the first insulation layer 112 may be etched to form an opening 114 exposing an upper surface of the first conductive pattern 110. The opening may be through the first insulation layer 112. That is, the insulation pattern 112a including the opening may be formed on the first conductive pattern 110.

Figure 5:
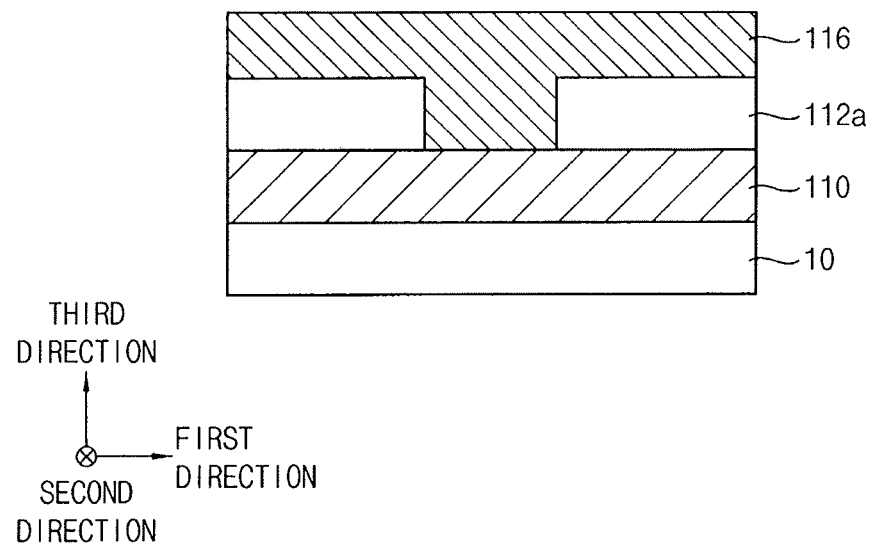

Referring to FIG. 5, a torque transfer layer 116 may be formed on the insulation pattern 112a to fill the opening 114. The torque transfer layer 116 may include a metal having an excellent transfer efficiency of a spin orbital torque. The torque transfer layer 116 may have a resistance lower than a resistance of the first conductive pattern 110. Preferably, a difference between the resistance of the torque transfer layer 116 and the resistance of the first conductive pattern 110 may be large. In exemplary embodiments, the torque transfer layer 116 may include a metal, e.g., copper, aluminum, tungsten, silver, gold, etc.

Figure 6:
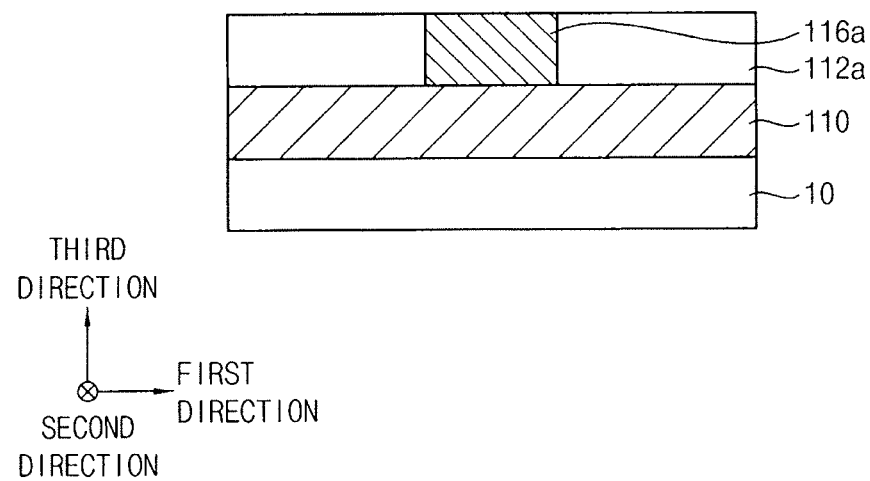

Referring to FIG. 6, the torque transfer layer 116 may be planarized until an upper surface of the insulation pattern 112a is exposed to form the torque transfer pattern 116a filling the opening 114. The planarization process may include a chemical mechanical polishing or an etch back process. Thus, upper surfaces of the insulation pattern 112a and the torque transfer pattern 116a may be coplanar with each other.

The torque transfer pattern 116a may contact a portion of the upper surface of the first conductive pattern 110. The torque transfer pattern 116a may have a pillar shape.

Figure 7:
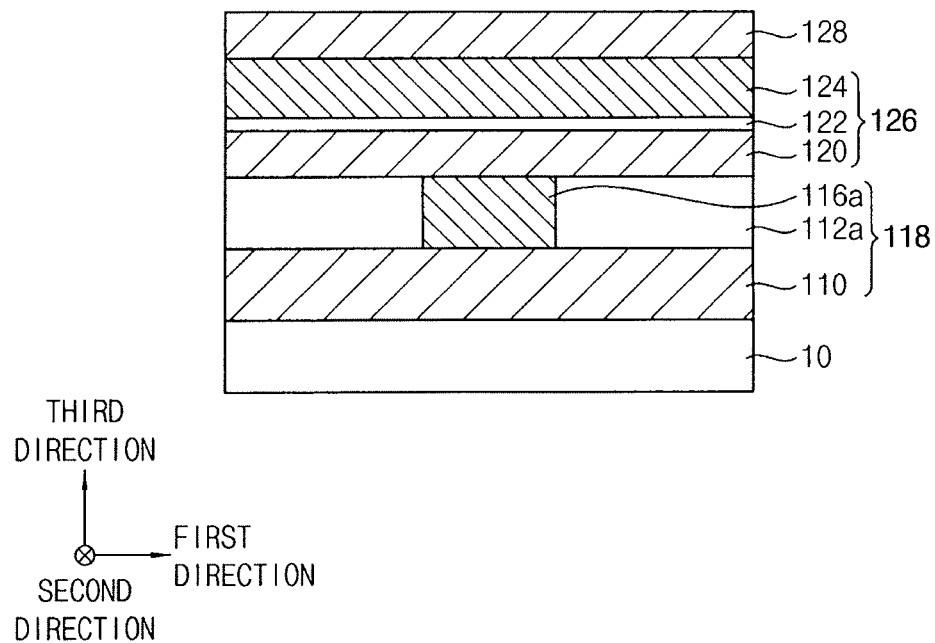

Referring to FIG. 7, the MTJ layer 126 may be formed on the insulation pattern 112a and the torque transfer pattern 116a. An upper electrode layer 128 may be formed on the MTJ layer 126.

The MTJ layer 126 may include a free layer 120, a tunnel barrier layer 122, and a fixed layer 124. The free layer 120 may contact the upper surfaces of the insulation pattern 112a and the torque transfer pattern 116a. That is, the free layer 120, the tunnel barrier layer 122, and the fixed layer 124 may be sequentially stacked on the upper surfaces of the insulation pattern 112a and the torque transfer pattern 116a.

The upper electrode layer 128 may serve as a mask for etching of the MTJ layer 126. The upper electrode layer 128 may include a metal. In exemplary embodiments, the upper electrode layer 128 may include, e.g., tungsten, copper, platinum, nickel, silver, gold, etc.

Figure 8:
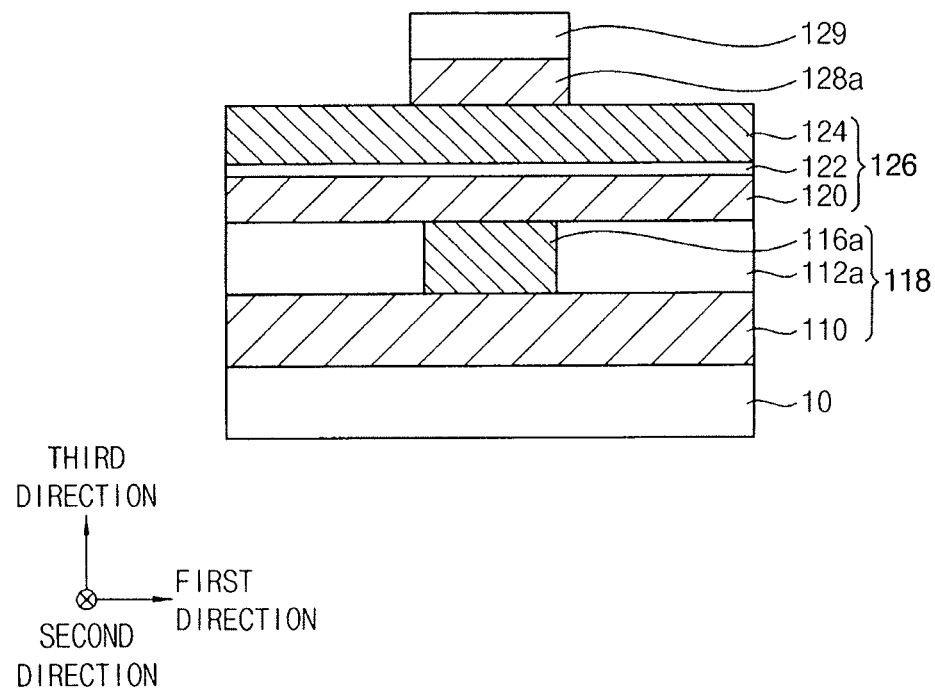

Referring to FIG. 8, a hard mask 129 may be formed on the upper electrode layer 128, and the upper electrode layer 128 may be anisotropically etched using the hard mask 129. Thus, the upper electrode 128a may be formed on the MTJ layer 126.

In exemplary embodiments, the etch process may include a reactive ion etching (RIE) process. The upper electrode 128a may overlap the upper surface of the torque transfer pattern 116a.

Figure 9:
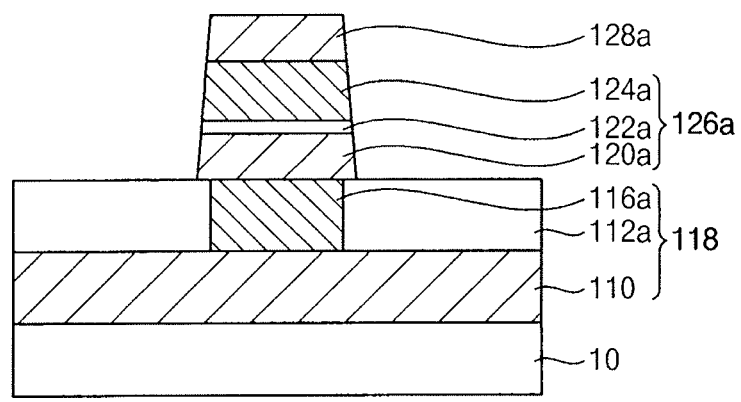
Figure 9:
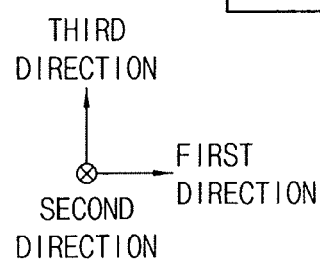

Referring to FIG. 9, the MTJ layer 126 may be anisotropically etched using the hard mask 129 and the upper electrode 128a as an etch mask. Therefore, the MTJ structure 126a may be formed on the torque transfer pattern 116a.

The etching process may include a physical etching process, e.g., an ion beam etching (IBE) process. For example, the etching process may include an argon ion sputtering etching process. In exemplary embodiments, the etching process may be performed while changing an incident angel of ion beams used as etching source.

When the etching process is performed, the insulation pattern 112a may be used as an etch stop layer. That is, the MTJ layer 126 may be etched until the upper surface of the insulation pattern 112a is exposed.

The MTJ structure 126a may include the free layer pattern 120a, the tunnel barrier pattern 122a, and the fixed layer pattern 124a sequentially stacked. The MTJ structure 126a may have a pillar shape.

In exemplary embodiments, a lower width of the MTJ structure 126a may be greater than an upper width of the MTJ structure 126a. That is, a width of the MTJ structure 126a may gradually increase from an upper portion of the MTJ structure 126a to a lower portion of the MTJ structure 126a. A sidewall of the MTJ structure 126a may have an inclination. In some exemplary embodiments, a lower width of the MTJ structure 126a may be substantially the same as an upper width of the MTJ structure 126a. That is, a side wall of the MTJ structure may be vertical.

The MTJ structure 126a may cover the upper surface of the torque transfer pattern 116a. That is, the upper surface of the torque transfer pattern 116a may not be exposed. In addition, a lower surface of the MTJ structure 126a may be the same as or greater than an upper surface of the torque transfer pattern 116a.

As the insulation pattern 112a is used as an etch stop layer in the etching process, layers may be easily etched to an accurate position. Thus, defects due to an over etching may be decreased in the etching process for forming the MTJ structure 126a. That is, defects, e.g., an over etching of the first conductive pattern 110 under the MTJ structure 126a in the etching process may be decreased. Thus, it is not necessary to increase a thickness of the first conductive pattern 110 in consideration of the over etching. Also, the thickness of the first conductive pattern 110 may be formed to a desired target thickness.

In addition, after etching for forming the MTJ structure 126a, the insulation pattern 112a may be exposed at a lateral direction of the MTJ structure 126a. That is, the conductive metal material may not be exposed at the lateral direction of the MTJ structure 126a, and thus a re-deposition of the metal material on a sidewall of the MTJ structure 126a may be reduced in the etching process. Thus, electrical short defects between the free layer pattern 120a and the fixed layer pattern 124a due to the re-deposited metal material may be reduced.

When the etching process is performed, the hard mask 129 may be removed, and an upper portion of the upper electrode 128a may be partially removed.

As described above, a SOT-magnetoresistive memory cell structure may be formed.

Figure 10:
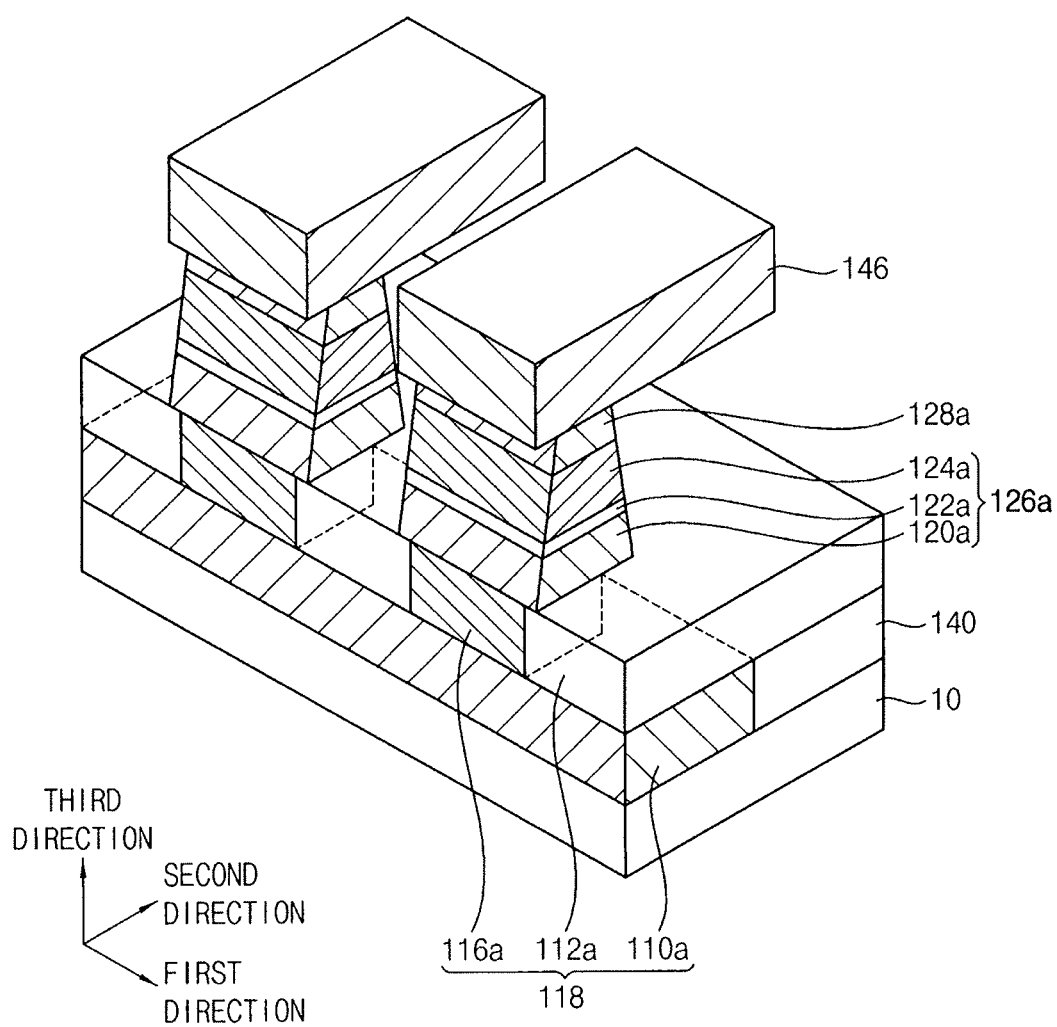
FIGS. 10 and 11 illustrate a perspective view and a cross-sectional view of a SOT-MRAM device in accordance with exemplary embodiments.
Figure 11:
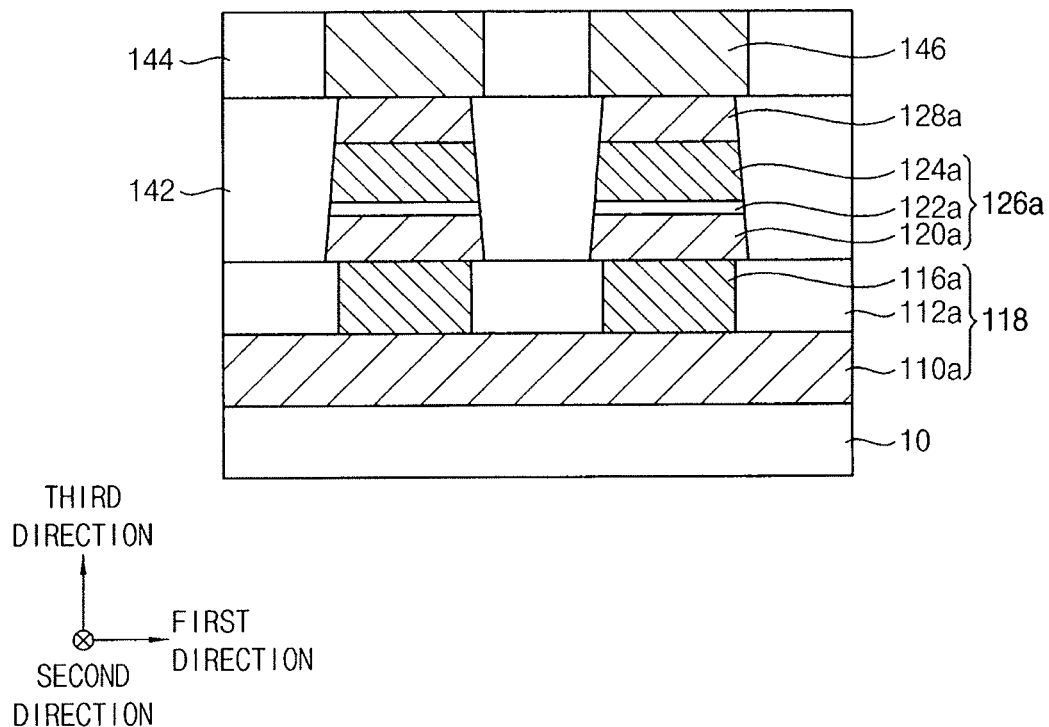

FIGS. 10 and 11 are a perspective view and a cross-sectional view of a SOT-MRAM device in accordance with exemplary embodiments.

The SOT-MRAM device may include a SOT-magnetoresistive memory cell structure substantially the same as that described with reference to FIG. 1. The SOT-MRAM may have a cross-point array.

Referring to FIGS. 10 and 11, the first conductive pattern 110a, the torque transfer patterns 106a, the insulation pattern 112a, the MTJ structures 126a, the upper electrodes 128a, and a second conductive patterns 146 may be formed on the lower structure 10. Also, a lower insulation pattern 140, a first upper insulation pattern 142, and a second upper insulation pattern 144 may be further formed.

The first conductive pattern 110a may have a line shape extending in the first direction parallel to an upper surface of the conductive pattern 110a. In exemplary embodiments, the plurality of first conductive patterns 110a may be parallel to each other.

The lower insulation pattern 140 may be formed between the first conductive patterns 110a. For example, as illustrated in FIG. 10, the lower insulation pattern 140 and the first conductive patterns 110a may have longitudinal directions extending along the first direction, and may be adjacent to each other, e.g., directly contact each other, along the second direction. Upper surfaces of the first conductive patterns 110a and the lower insulation pattern 140 may be coplanar with each other.

The torque transfer patterns 116a may be formed on the first conductive patterns 110a. In the exemplary embodiments, the torque transfer patterns 116a may have a pillar shape, and may be regularly arranged to be spaced apart from each other. For example, as illustrated in FIG. 10, a plurality of torque transfer patterns 116a may be formed in same first conductive patterns 110a to be spaced apart from each other along the first direction.

The insulation pattern 112a may be formed on the first conductive pattern 110a and the lower insulation pattern 140, and may fill the space between the torque transfer patterns 116a. For example, as illustrated in FIG. 10, the insulation pattern 112a may surround a perimeter of each of the plurality of torque transfer patterns 116a. Upper surfaces of the torque transfer patterns 116a and the insulation pattern 112a may be coplanar with each other.

The MTJ structures 126a may be formed on the torque transfer patterns 116a, respectively. The free layer pattern 120a may contact the upper surface of the torque transfer pattern 116a. The upper electrodes 128a may be formed on the MTJ structures 126a, respectively.

The first conductive pattern 110a may be substantially the same as the first conductive pattern described with reference to FIG. 1. However, the first conductive pattern 110a may have a line shape extending in the first direction. The torque transfer pattern 116a, the insulation pattern 112a, the MTJ structure 126a, and the upper electrode 128a may be substantially the same as those described with reference to FIG. 1, respectively.

The first upper insulation pattern 142 may be formed to fill a space between stacked structures including the MTJ structure 126a and the upper electrode 128a. In exemplary embodiments, the first upper insulation pattern 142 may include, e.g., silicon oxide, silicon nitride, or silicon oxynitride, etc. In exemplary embodiments, upper surfaces of the upper electrode 128a and the first upper insulation pattern 142 may be coplanar with each other.

The second conductive patterns 146 may be formed on the upper electrode 128a. In some embodiments, the upper electrode 128a may not be formed. In this case, the second conductive patterns 146 may be formed on the fixed layer pattern 124a of the MTJ structure 126a. Thus, each of the second conductive patterns 146 may be electrically connected to the fixed layer patterns 124a arranged in the first direction.

The second conductive patterns 146 may have a line shape extending in a second direction perpendicular to the first direction and parallel to the upper surface of the first conductive pattern 110a. The second conductive patterns 146 may be parallel to each other.

The second upper insulation pattern 144 may be formed to fill a space between the second conductive patterns 146. In exemplary embodiments, the second upper insulation pattern 144 may include, e.g., silicon oxide, silicon nitride, or silicon oxynitride, etc. Upper surfaces of the second conductive patterns 146 and the second upper insulation pattern 144 may be coplanar with each other.

The MTJ structures 126a may be formed at cross points of the first conductive pattern 110a and the second conductive pattern 146, respectively. Thus, the SOT-MRAM device may have a cross-point array.

In the SOT-MRAM device, spin-polarized currents flow to the free layer pattern 120a via the first conductive pattern 110a and the torque transfer pattern 116a, so that data may be written in the MTJ structure 126a. A direction of the spin-polarized current may be changed by the torque transfer pattern 116a so that a spin torque generated in the first conductive pattern 110a may be effectively transferred to the free layer pattern 120a. At this time, the data may be written only in one selected MTJ structure by controlling a voltage of the second conductive pattern 146.

Figure 12:
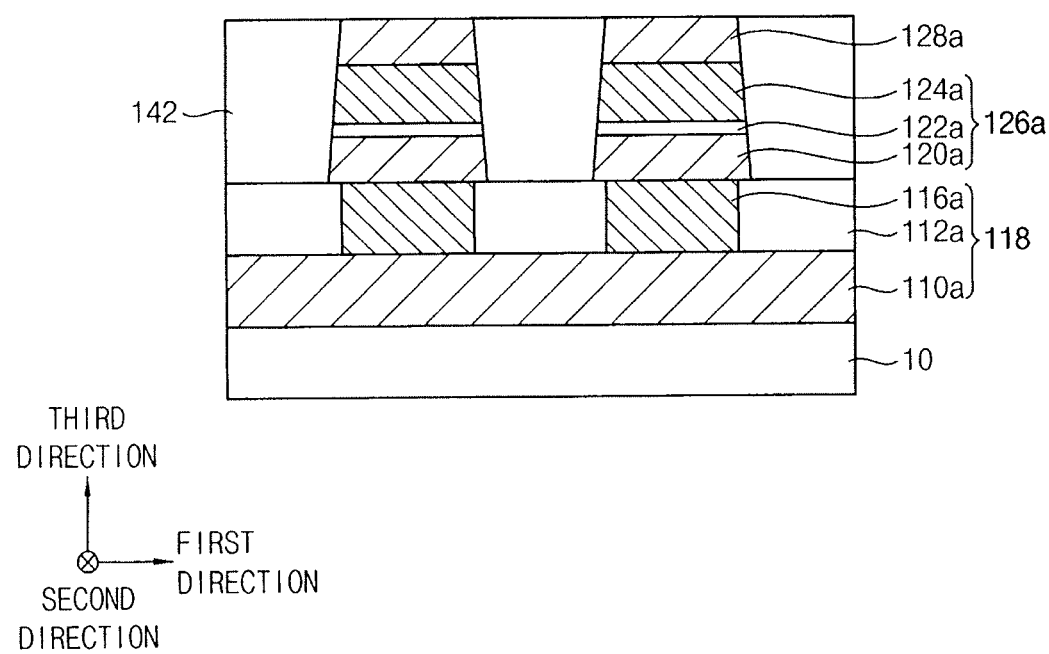
FIGS. 12 and 13 illustrate cross-sectional views of stages in a method of manufacturing a SOT-MRAM device in accordance with example embodiments.
Figure 13:
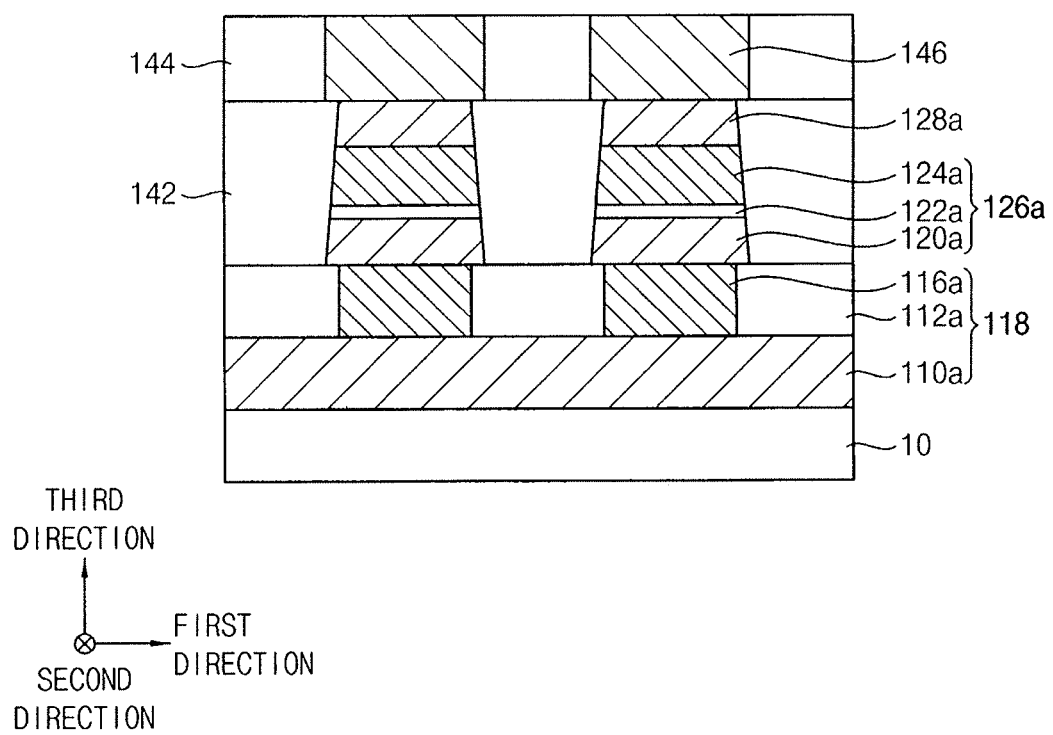

FIGS. 12 and 13 are cross-sectional views illustrating stages of a method of manufacturing a SOT-MRAM device in accordance with example embodiments.

Referring to FIG. 12, first, the same processes as those described with reference to FIGS. 2 to 9 may be performed on the lower structure 10. However, in a patterning process of the first conductive patterns 110a, the first conductive patterns 110a may be formed to have a line shape extending in the first direction. Thus, as shown in FIG. 9, the SOT-magnetoresistive memory cell structure 130 may be formed.

Thereafter, a first upper insulation layer may be formed on the insulation pattern 112a to fill a space between stacked structures including the MTJ structure 126a and the upper electrode 128a. The first upper insulation layer may be planarized until an upper surface of the upper electrode 128a is exposed. Thus, the first upper insulation pattern 142 may be formed between the stacked structures including the MTJ structure 126a and the upper electrode 128a.

Referring to FIG. 13, the second conductive patterns 146 having a line shape extending in the second direction may be formed on the first upper insulation pattern 142 and the upper electrode 128a. The second upper insulation patterns 144 may be formed between the second conductive patterns 146.

In exemplary embodiments, the second conductive patterns 146 and the second upper insulation pattern 144 may be formed through a damascene process. For example, a second upper insulation layer may be deposited, and the second upper insulation layer may be patterned to form the second upper insulation patterns 144. Thereafter, a second conductive layer may be formed to fill a space between the second upper insulation patterns 144. The second conductive layer may be planarized until upper surfaces of the second upper insulation patterns 144 may be exposed to form the second conductive patterns 146. The planarization process may include a chemical mechanical polishing or an etch back process.

In some exemplary embodiments, the second conductive patterns 146 may be formed by a patterning process in relief. That is, a second conductive layer may be formed, and the second conductive layer may be patterned to form the second conductive patterns 146. Also, a second upper insulation layer may be formed to cover the second conductive patterns 146. The second upper insulation layer may be planarized until upper surfaces of the second conductive patterns 146 may be exposed to form the second upper insulation patterns 144. The planarization process may include a chemical mechanical polishing or an etch back process.

Figure 14:
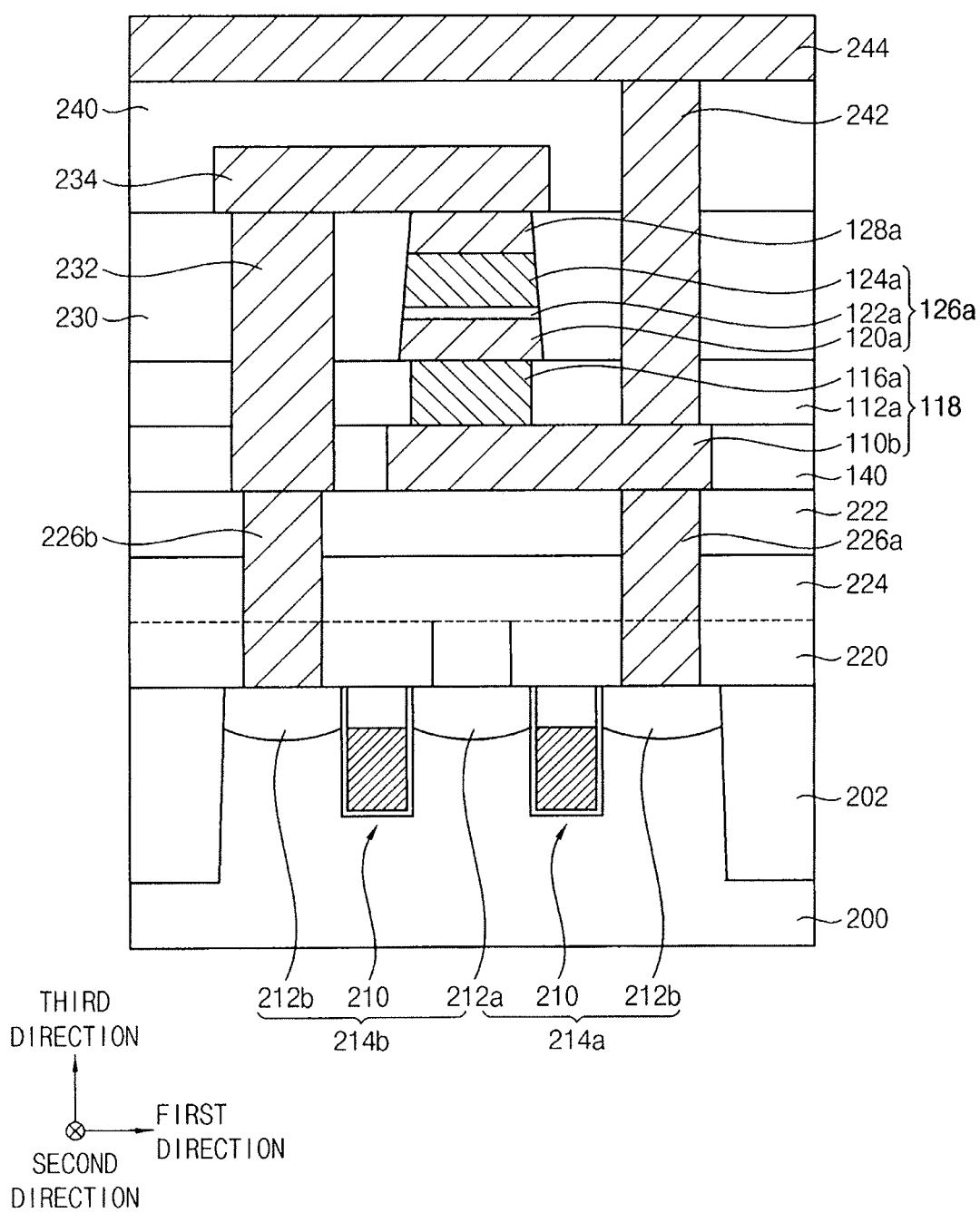
FIG. 14 illustrates a cross-sectional view of a SOT-MRAM device in accordance with exemplary embodiments.

FIG. 14 is a cross-sectional view illustrating a SOT-MRAM device in accordance with exemplary embodiments.

The SOT-MRAM device may include a SOT-magnetoresistive memory cell structure substantially the same as that described with reference to FIG. 1.

Referring to FIG. 14, a substrate 200 may include a semiconductor material including, e.g., silicon, germanium or silicon-germanium. In some exemplary embodiments, the substrate 200 may be a silicon-on-insulator (SOI) substrate or a gerthanium-on-insulator (GOI) substrate.

An isolation layer 202 may be formed at the substrate 200, and thus an active region and a field region may be defined in the substrate 200.

Cell transistors 214a and 214b may be formed on the substrate 200. In exemplary embodiments, the cell transistors 214a and 214b may be a buried gate transistor in which a gate 210 may be formed within a trench of the substrate 200. The gate 210 may extend in the second direction to have a line shape. First and second impurity regions 212a and 212b may be formed adjacent to sidewalls of the gate 210, respectively. In some example embodiments, ones of the cell transistors 214a and 214b may be a planar type transistor or a fin type transistor.

In exemplary embodiments, one memory cell may be connected to two cell transistors. For example, the two cell transistors may include a first transistor 214a electrically connected to the first conductive pattern 110b, and the second transistor 214b electrically connected to the fixed layer pattern 124a. In this case, the first impurity regions 212a of the first and second transistors 214a and 214b may be shared.

A first insulating interlayer 220 and a second insulating interlayer 222 may be formed on the substrate 200 to cover the first and second transistors 214a and 214b. A source line 224 may be formed in the first insulating interlayer 220. The source line 224 may extend to be in contact with the first impurity region 212a.

Contact plugs 226a and 226b may be through the first and second insulating interlayers 220 and 222, and may contact the second impurity region 212b. The contact plug contacting the second impurity region 212b of the first transistor 214a is referred to as a first contact plug 226a, and the contact plug contacting the second impurity region 212b of the second transistor 214b is referred to as a second contact plug 226b.

The first conductive pattern 110b may be formed on the second insulating interlayer 222. The first conductive pattern 110b may contact the first contact plug 226a. The first conductive pattern 110b may include a same material as the material of the first conductive pattern described with reference to FIG. 1.

In exemplary embodiments, the first conductive pattern 110b may have an isolated shape. A longitudinal direction of the first conductive pattern 110b may be a direction perpendicular to an extending direction of the gate 210. That is, the longitudinal direction of the first conductive pattern 110b may be the first direction. The first conductive pattern 110b may be spaced apart from the second contact plug 226b.

The torque transfer pattern 116a, the insulation pattern 112a, the MTJ structure 126a, and the upper electrode 128a may be formed on the first conductive pattern 110b. The torque transfer pattern 116a, the insulation pattern 112a, the MTJ structure 126a and the upper electrode 128a are substantially the same as the torque transfer pattern, the insulation pattern, the MTJ structure and the upper electrode described with reference to FIG. 1, respectively.

Also, a lower insulation pattern 140 may be formed on a side of the first conductive pattern 110b. A first upper insulation pattern 230 may be formed on sides of the MTJ structure 126a and the upper electrode 128a.

The torque transfer pattern 116a may contact a portion of an upper surface of the first conductive pattern 110b. The first conductive pattern 110b and the torque transfer pattern 116a are disposed so that a direction of current flowing from the first conductive pattern 110b through the torque transfer pattern 116a may be changed to the vertical direction from the horizontal direction. As the torque transfer pattern 116a is formed, a direction of spin polarized current may be changed. Thus, the spin torque generated in the first conductive pattern 110b may be effectively transferred to the free layer pattern 120a.

A third contact plug 232 may be through the lower insulation pattern 140, the insulation pattern 112a and the first upper insulation pattern 230. Thus, the third contact plug 232 may be electrically connected to the second contact plug 226b. Also, a connection pattern 234 may be connected to upper surfaces of the third contact plug 232 and the upper electrode 128a. Thus, the fixed layer pattern 124a of the MTJ structure 126a and the second impurity region 212b of the second transistor 214b may be electrically connected to each other by the second contact plug 226b, the third contact plug 232, and the connection pattern 234.

A third insulating interlayer 240 may be formed on the first upper insulation pattern 230 to cover the connection pattern 234. A fourth contact plug 242 may be through the third insulating interlayer 240, the first upper insulation pattern 230 and the insulation pattern 112a. Thus, the fourth contact plug 242 may be electrically connected to the first conductive pattern 110b. An upper conductive pattern 244 may be formed on the fourth contact plug 242. For example, the upper conductive pattern 244 may have a line shape extending in the first direction. The upper conductive pattern 244 may be electrically connected to the first conductive pattern 110b, so that the upper conductive pattern 244 may serve as a conductive line for writing data.

As described above, a unit memory cell may include two cell transistors 214a, 214b and one MTJ structure 126a, and in this case the SOT-magnetoresistive memory cell structure may be used as well in the SOT-MRAM. That is, even if a stacked structure of the unit memory cell is changed, the SOT-magnetoresistive memory cell structure may be used in the SOT-MRAM.

FIGS. 15 to 19 are cross-sectional views illustrating stages in a method of manufacturing an MRAM device in accordance with example embodiments.

Figure 15:
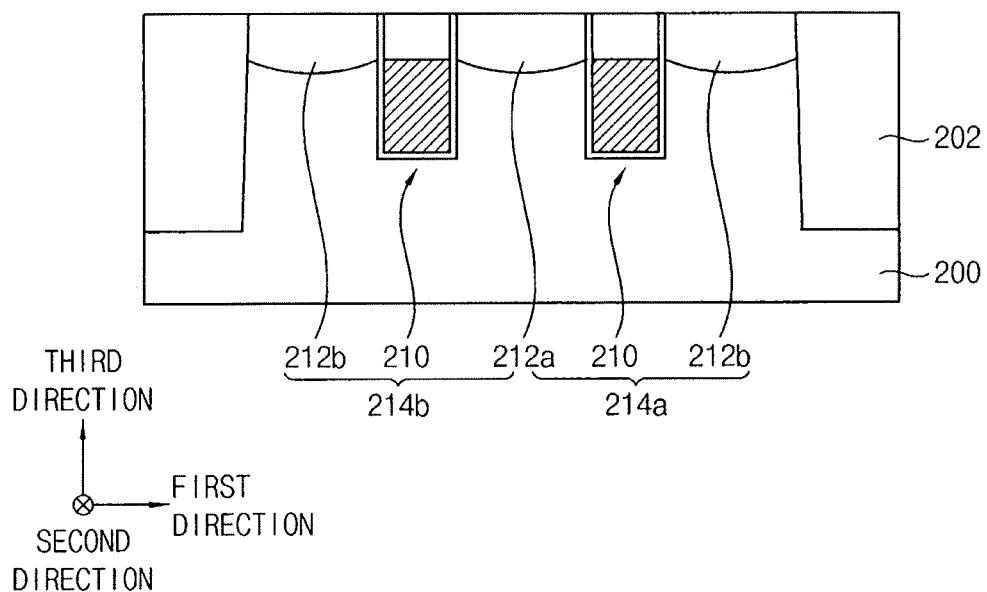
FIGS. 15 to 19 illustrate cross-sectional views of stages in a method of manufacturing an MRAM device in accordance with example embodiments.

Referring to FIG. 15, an isolation layer 202 may be formed on the substrate 200, and thus the substrate 200 may be divided into an active region and a field region. The isolation layer 202 may be formed by shallow trench isolation (STI) process.

First and second transistors 214a and 214b may be formed on the substrate 200. The first and second transistors 214a and 214b may serve as cell transistors.

In exemplary embodiments, a portion of the substrate 200 may be etched to form trenches, and the gate 210 may be formed in each of the trenches. The first impurity region 212a and the second impurity region 212b may be formed in the substrate 200 adjacent sidewalls of the gate 210. Thus, the first and second transistors 214a and 214b may be formed. In this case, the first and second transistors 214a and 214b may be buried gate type transistors. The first impurity region 212a may be disposed between adjacent first and second transistors 214a and 214b, so that the first impurity region 212a may be commonly used in the first and second transistors 214a and 214b.

Figure 16:
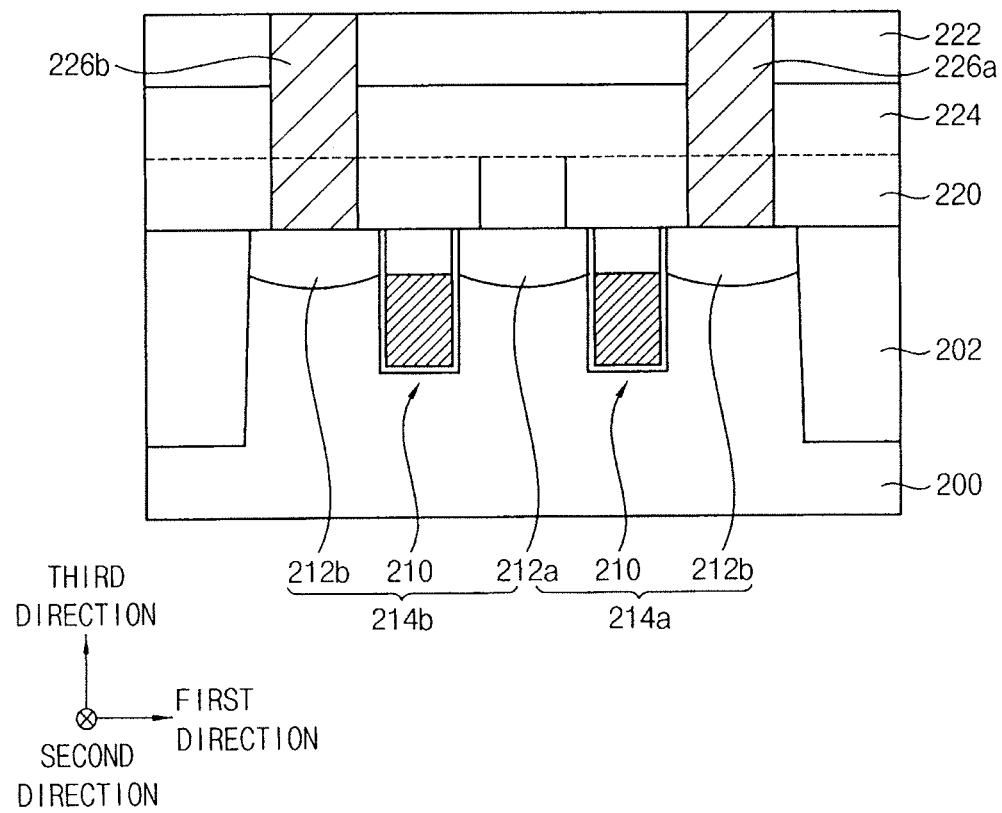

Referring to FIG. 16, the first insulating interlayer 220 is formed on the substrate 200. The source lines 224 may be formed in the first insulating interlayer 220, and the source lines 224 may contact the first impurity region 212a.

The second insulating interlayer 222 may be formed on the first insulating interlayer 220 and the source lines 224. The first contact plug 226a and the second contact plug 226b May be formed through the first and second insulating interlayers 220 and 222. The first and second contact plugs 226a and 226b may be electrically connected to the second impurity regions 212b, respectively. The first contact plug 226a may be electrically connected to the second impurity region 212b of the first transistor 214a, and the second contact plug 226b may be electrically connected to the second impurity region 212b of the second transistor 214b.

Figure 17:
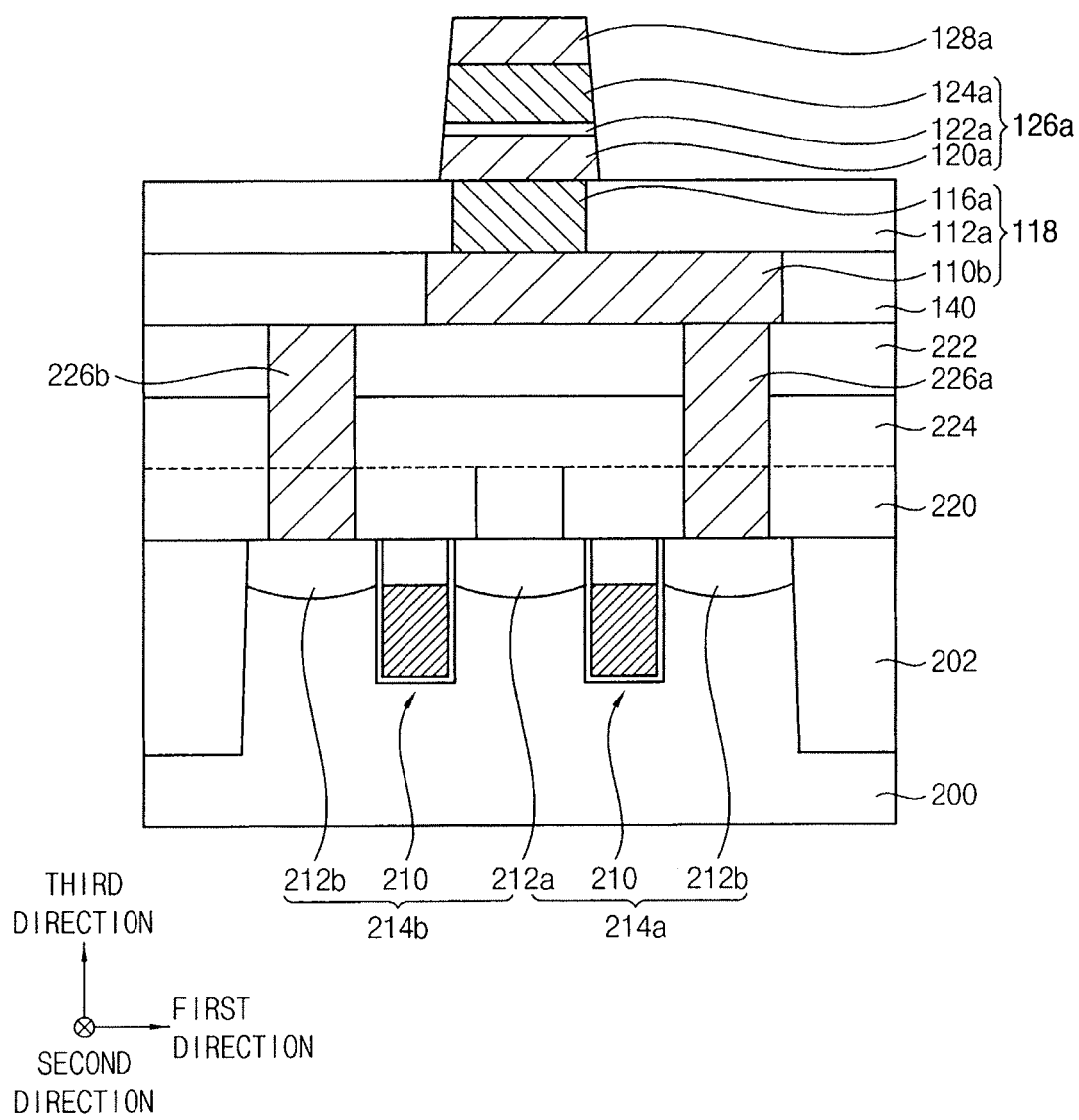

Referring to FIG. 17, the first conductive pattern 110b may be formed on the first contact plug 226a and the second insulating interlayer 222. The lower insulation pattern 140 may be formed on a side of the first conductive pattern 110b. The first conductive pattern 110b may be formed to have an isolated shape. A longitudinal direction of the first conductive pattern 110b may be the first direction.

The torque transfer pattern 116a and the insulation pattern 112a may be formed on the first conductive pattern 110b and the lower insulation pattern 140. Then, the MTJ structure 126a and the upper electrode 128a may be formed on the torque transfer pattern 116a.

Processes for forming the first conductive pattern 110b, the lower insulation pattern 140, the torque transfer pattern 116a, the insulation pattern 112a, the MTJ structure 126a, and the upper electrode 128a may be substantially the same as or similar to those described with reference to FIGS. 2 to 9.

Figure 18:
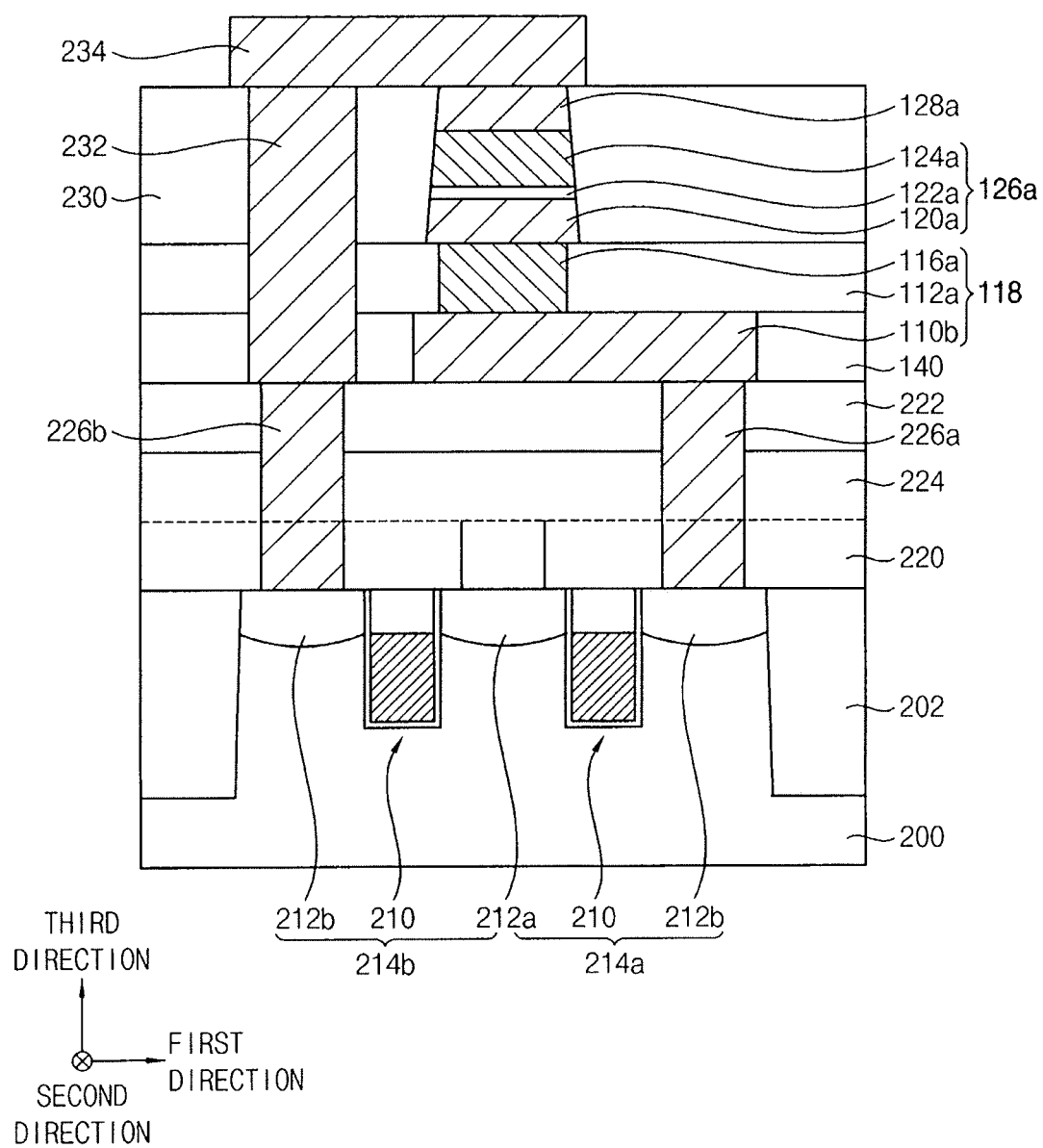

Referring to FIG. 18, an insulation layer covering the stacked structures including the MTJ structure 126a and the upper electrode 128a may be formed on the insulation pattern 112a. The insulation layer may be planarized until the upper surface of the upper electrode 128a may be exposed to form a first upper insulation pattern 230.

The third contact plug 232 may be formed through the first upper insulation pattern 230, the insulation pattern 112a and the lower insulation pattern 140. The third contact plug 232 may contact the upper surface of the second contact plug 226b. The third contact plug 232 may be spaced apart from the MTJ structure 126a.

Thereafter, a connection pattern 234 for electrically connecting the third contact plug 232 and the upper electrode 128a to each other may be formed on the first upper insulation pattern 230. The connection pattern 234 may contact upper surfaces of the third contact plug 232 and the upper electrode 128a. The connection pattern 234 may include a metal. Thus, the fixed layer pattern 124a of the MTJ structure 126a and the second impurity region 212b of the second transistor 214b may be electrically connected to each other.

Figure 19:
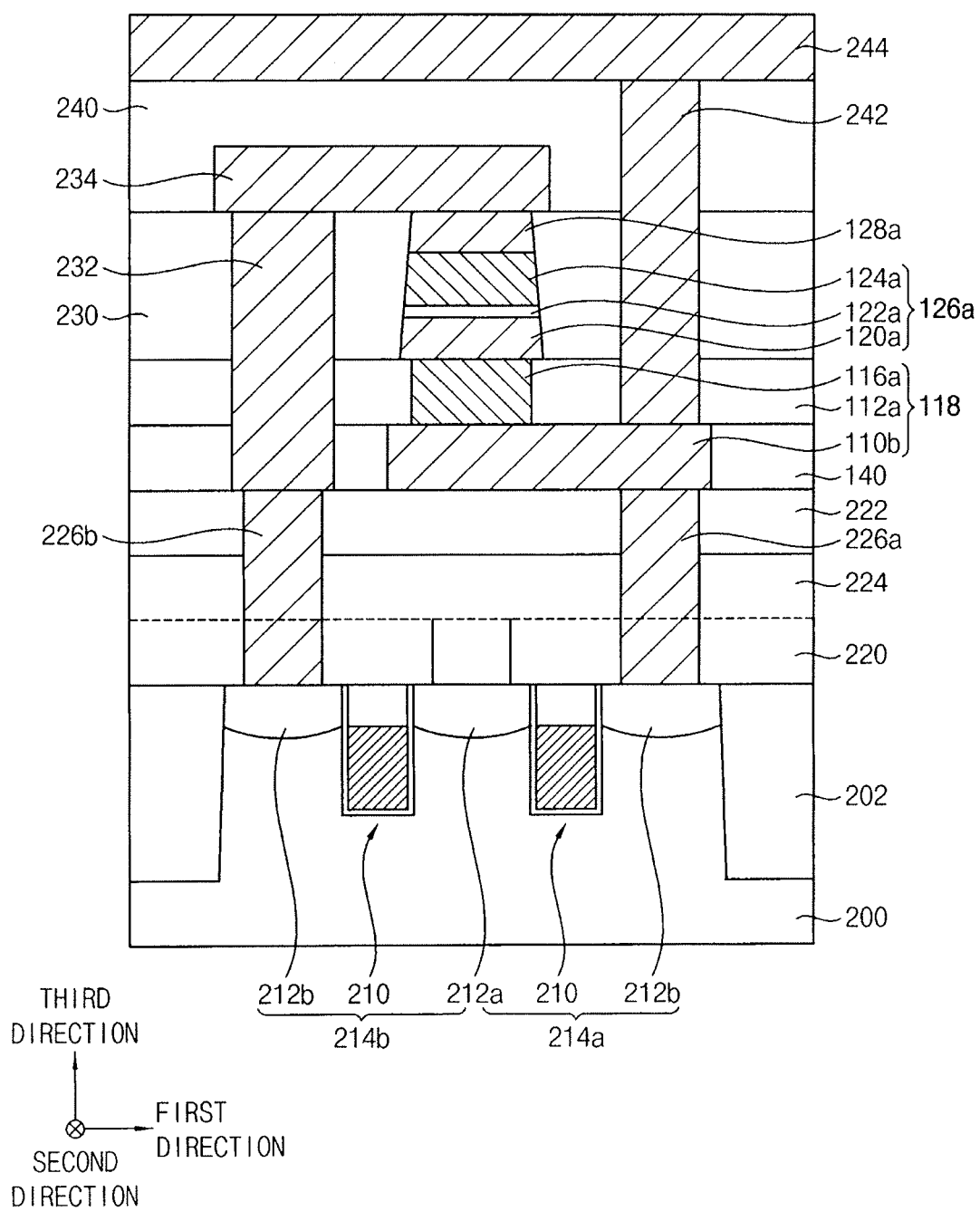

Referring to FIG. 19, the third insulating interlayer 240 may be formed on the first upper insulation pattern 230 to cover the connection pattern 234.

The fourth contact plug 242 may be formed through the third insulating interlayer 240, the first upper insulation pattern 230, and the insulation pattern 112a. The fourth contact plug may contact the upper surface of the first conductive pattern 110b. The upper conductive pattern 244 may be formed on the third contact plug 232 and the third insulating interlayer 240. In exemplary embodiments, the upper conductive pattern 244 may have a line shape extending in the first direction.

As described above, a SOT-MRAM device may be manufactured. The SOT-MRAM device in accordance with exemplary embodiments may be used as a memory included in an electronic product such as a mobile device, a memory card, and a computer, etc.

By way of summation and review, exemplary embodiments provide an MRAM device having improved characteristics. Exemplary embodiments provide methods of manufacturing an MRAM device having improved characteristics.

That is, in the MRAM device according to exemplary embodiments, a torque transfer pattern may be formed between the first conductive pattern for generating the spin orbital torque and the MTJ structure. That is, the current generated from the first conductive pattern may flow through the torque transfer pattern, and a direction of the current may be changed to a vertical direction from a horizontal direction. Thus, a spin torque may be effectively transferred to the MTJ structure. As such, data may be written in the free layer pattern through the first conductive pattern and the torque transfer pattern, thereby providing an MRAM device with excellent data writing characteristics In addition, an insulation pattern may be formed on sides of the torque transfer pattern to surround the torque transfer pattern. The insulation pattern may serve as a stopper in the etching process for forming the MTJ structure. Therefore, the first conductive pattern may not be exposed in the etching process. Thus, the first conductive pattern may not be damaged during the etching process, and the first conductive pattern may not be re-deposited on the sidewalls of the MTJ structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A magnetoresistive random access memory (MRAM) device, comprising:
   a first conductive pattern including a material generating a spin orbital torque;
   a torque transfer pattern contacting a portion of an upper surface of the first conductive pattern;
   an insulation pattern on a side of the torque transfer pattern and covering the first conductive pattern; and
   a magnetic tunnel junction (MTJ) structure on the torque transfer pattern, the MTJ structure including a free layer pattern, a tunnel barrier pattern, and a fixed layer pattern sequentially stacked.

2. The MRAM device as claimed in claim 1, wherein the first conductive pattern includes a horizontal magnetic material.

3. The MRAM device as claimed in claim 1, wherein the first conductive pattern includes at least one of Pt, Ta, W, Hf, Ir, CuBi, CuIr, and AuW.

4. The MRAM device as claimed in claim 1, wherein the first conductive pattern has a thickness of about 5 Å to about 100 Å.

5. The MRAM device as claimed in claim 1, wherein the torque transfer pattern includes a metal having a resistance lower than a resistance of the first conductive pattern.

6. The MRAM device as claimed in claim 1, wherein the MTJ structure covers an upper surface of the torque transfer pattern.

7. The MRAM device as claimed in claim 6, wherein a first width of a lower surface of the MTJ structure is equal to or greater than a second width of the upper surface of the torque transfer pattern.

8. The MRAM device as claimed in claim 1, wherein the insulation pattern includes silicon nitride, silicon oxynitride, or silicon oxide.

9. The MRAM device as claimed in claim 1, wherein upper surfaces of the torque transfer pattern and the insulation pattern are coplanar with each other.

10. The MRAM device as claimed in claim 1, wherein the first conductive pattern has a line shape extending in a first direction parallel to the upper surface of the first conductive pattern.

11. The MRAM device as claimed in claim 10, further comprising a second conductive pattern on the MTJ structure and electrically connected with the fixed layer pattern, the second conductive pattern having a line shape extending in a second direction perpendicular to the first direction and parallel to the upper surface of the first conductive pattern.

12. The MRAM device as claimed in claim 1, wherein the first conductive pattern has an isolated pattern shape, and a longitudinal direction of the first conductive pattern is a first direction parallel to the upper surface of the first conductive pattern.

13. The MRAM device as claimed in claim 12, further comprising:
   an upper conductive line electrically connected to the first conductive pattern; and
   a first transistor electrically connected to the first conductive pattern.

14. The MRAM device as claimed in claim 12, further comprising a second transistor electrically connected to the fixed layer pattern of the MTJ structure.

15. A magnetoresistive random access memory (MRAM) device, comprising:
   a first conductive pattern including a material generating a spin orbital torque;
   a torque transfer pattern contacting a portion of an upper surface of the first conductive pattern, the torque transfer pattern protruding in a vertical direction from the upper surface of the first conductive pattern; and
   a magnetic tunnel junction (MTJ) structure on the torque transfer pattern, the MTJ structure including a free layer pattern, a tunnel barrier pattern, and a fixed layer pattern sequentially stacked, and the free layer pattern contacting an upper surface of the torque transfer pattern,
   wherein a width of the torque transfer pattern in a horizontal direction is smaller than each of a width of the MTJ structure and a width of the first conductive pattern in the horizontal direction.

16. The MRAM device as claimed in claim 15, wherein the first conductive pattern includes a horizontal magnetic material.

17. The MRAM device as claimed in claim 15, wherein the torque transfer pattern includes a metal having a resistance lower than a resistance of the first conductive pattern.

18. The MRAM device as claimed in claim 15, further comprising an insulation pattern on a side of the torque transfer pattern and covering the first conductive pattern.

19. The MRAM device as claimed in claim 18, wherein the upper surface of the torque transfer pattern and an upper surface of the insulation pattern are coplanar with each other.

20. A magnetoresistive random access memory (MRAM) device, comprising:
   a first conductive pattern including a material generating a spin orbital torque;
   a torque transfer pattern contacting a portion of an upper surface of the first conductive pattern;
   an insulation pattern on a side of the torque transfer pattern and covering the first conductive pattern;
   a magnetic tunnel junction (MTJ) structure on the torque transfer pattern, the MTJ structure including a free layer pattern, a tunnel barrier pattern, and a fixed layer pattern stacked, and the torque transfer pattern contacting the free layer pattern; and
   a second conductive pattern on the MTJ structure, the second conductive pattern being electrically connected to the fixed layer pattern.

* * * * *